United States Patent [19]
Wilson et al.

[11] 4,109,707
[45] Aug. 29, 1978

[54] FLUID COOLING SYSTEMS FOR ELECTRONIC SYSTEMS

[75] Inventors: Edward A. Wilson; James D. Fredenberg, both of Phoenix, Ariz.

[73] Assignee: Honeywell Information Systems, Inc., Phoenix, Ariz.

[21] Appl. No.: 778,308

[22] Filed: Mar. 16, 1977

Related U.S. Application Data

[62] Division of Ser. No. 592,578, Jul. 2, 1975.

[51] Int. Cl.² ........................... F28F 21/00; F28F 7/00
[52] U.S. Cl. ........................................ 165/46; 357/82; 361/385; 165/80; 165/170
[58] Field of Search .......... 165/80, DIG. 3, DIG. 21, 165/46, 170; 357/82; 361/385

[56] References Cited

U.S. PATENT DOCUMENTS 2,254,406  9/1941  Zarotschenzeff ............ 165/DIG. 21
3,649,738  3/1972  Andersson et al. ......... 165/DIG. 21

FOREIGN PATENT DOCUMENTS 796,763  6/1958  United Kingdom Great Britain ....................................... 165/80

Primary Examiner—Albert W. Davis, Jr.
Attorney, Agent, or Firm—Edward W. Hughes; William W. Holloway, Jr.; Ronald T. Reiling

[57] ABSTRACT

A fluid cooling system for electronic systems particularly adapted to cool large scale integrated circuit chips mounted on substrates. The system has one or more heat exchangers through which a liquid coolant is circulated. Each heat exchanger has a flexible wall and is mounted so that its flexible wall is in close proximity to a surface of the substrate to be cooled. A low thermal impedance contact is made through the flexible wall of the heat exchanger between the substrate to be cooled and the coolant flowing through the heat exchanger because of the pressure of the coolant in the heat exchanger. The heat exchangers are connected into the cooling system through flexible conduits so that a heat exchanger can readily be moved out of contact with a substrate without disrupting the flow of coolant through the cooling system.

6 Claims, 7 Drawing Figures

FLUID COOLING SYSTEMS FOR ELECTRONIC SYSTEMS

This is a division of application Ser. No. 592,578, filed July 2, 1975.

SUMMARY OF THE INVENTION

The present invention relates generally to a system for cooling multichip integrated circuit assemblies or micropackages and more particularly to a heat exchanger for cooling such micropackages in order to maintain the operating temperatures of the integrated circuit chips of said micropackages below maximum operating temperatures.

There is a trend in the microelectronic circuit packaging technology toward micropackages comprised of a multilayer printed circuit wiring board or substrate on which a large number of conductive and insulative layers are formed. A large number (i.e., from 50 to 100) of large scale integrated circuit semiconductor chips can be mounted on one surface or one side of the substrate of such a substantially square micropackage having dimensions of 80mm by 80mm, for example. While advance circuit design technology is developing circuits in which the power dissipated per active element or gate on a chip is reduced, the greatly increased number of such active elements per chip results in an increase in the amount of electrical power being consumed with a concomitant increase in the total amount of heat produced. As a result of this increase in heat produced, improved cooling means are needed to effectively cool such micropackages to keep the maximum temperature of the semiconductor chips of such micropackages below their maximum operating temperature.

Until recently, the conventional way for cooling large electronic systems, such as computers for example, was by circulating cooled air through them. However, as the amount of heat to be dissipated in recently developed micropackages has grown to from 8 to 10 watts per square inch of usable area of the substrate, for example, compared with from 3 to 5 watts per square inch in the earlier packaging arrangements, the limits of cooling by air have substantially been reached. One of the problems associated with air cooling the recently developed micropackages is that to maintain the temperature of the active elements of a semiconductor device below their maximum temperature, it is necessary to increase the velocity of the air flowing past the devices to be cooled. The noise associated with the high velocity of the air to cool devices where heat has to be dissipated at the rates of from 8 to 10 watts per square inch is unacceptably high. Thus, one of the reasons for going to a liquid cooled system for micropackage assemblies is to solve or to avoid the noise problems associated with air cooled systems. Another problem solved by the liquid cooled system is that of effectively dissipating large amounts of heat, i.e., from 45 to 60 watts, through the substrate of a micropackage whose overall dimensions may be 80 millimeters square, for example, while maintaining the temperature of the integrated circuit chips in the micropackage below their maximum operating temperature.

While liquid cooling solves problems associated with air cooling large electronic systems such as computers, liquid cooling systems have their own problems particularly when applied to a complex electronic system. In any such large system, components will from time to time fail. Repairing or replacing a failed component may require replacing a micropackage. In doing so it is desirable that no coolant escape to contaminate electrical contacts of the electronic system.

Another problem that has to be solved is how to minimize the thermal impedance between the substrates of the micropackages and the coolant flowing through the heat exchanger in contact with the substrate. This problem is complicated because the substrates of the micropackages while substantially flat initially are not perfectly flat when completed. Thus the surface which will come into contact with a heat exchanger deviates from being flat in part at least as the result of the process of putting down the many conductive and insulative layers. This involves several cycles of baking at elevated temperatures plus heat applied in soldering integrated circuit chips on the substrates of micropackages. Therefore, it is necessary in order to obtain low thermal resistance between a substrate to be cooled and a heat exchanger that the portion of the heat exchanger adapted to physically contact the substrate be capable of adapting to the absence of flatness.

Thus, a heat exchanger that is particularly adapted to cool a micropackage having a substrate of substantial area, i.e., from 4 to 10 square inches, or 25 to 64 $CM^2$ and through which substrate a large heat flux per unit area must be dissipated if excessive temperatures within the micropackage are not to be reached, requires good thermal contact between the heat exchanger and the substrate of the micropackage. In addition the cooling system of the heat exchanger or a part must permit the removal of a micropackage from its connector to either replace or repair it, without liquid coolant escaping from the cooling system.

Therefore, it is an object of the present invention to provide an improved cooling system for electronic systems.

It is another object of the present invention to provide an improved heat exchanger for an assembly of multichip integrated circuits mounted on a substrate.

It is also an object of the present invention to provide a cooling system for integrated circuit assemblies that can be removed from heat exchange relationship with any one of such assemblies without coolant escaping from the cooling system, or without interrupting the continued operation of the cooling system.

It is still a further object of the present invention to provide an improved low cost liquid heat exchanger for a microelectronic circuit package which is quiet in operation and minimizes the risk of the liquid coming into contact with such a package, the connector in which the package is mounted, and any other components of the overall system of which the package is a part.

These and other objects of the present invention are achieved according to one embodiment thereof by providing a heat exchange chamber, one surface or wall of which is made of a very thin flexible good thermal conductive material. Inlet and outlet means are provided in the chamber so that a heat exchange medium or liquid can circulate through the chamber and contact the inner side of the flexible wall of the chamber to conduct heat away from the substrate of an electronic package. Because of the flexibility of this wall and the manner in which it is mounted the pressure of the circulating heat exchange medium in the chamber forces the flexible wall into good mechanical contact with the substrate of the micropackage to be cooled. This wall is sufficiently flexible so that it can accommodate deviations from a plane, by the surface of a substrate and thus provides an excellent heat transfer path, i.e., one having minimal thermal impedance without the necessity of providing any special oils or greases to improve the thermal conductivity between a substrate to be cooled and the flexible wall of the heat exchanger.

BRIEF DESCRIPTION OF THE DRAWINGS

This invention is pointed out with particularity in the appended claims, however, other objects and features of the invention will become more apparent and the invention itself will be better understood by referring to the following description and embodiments taken in conjunction with the accompanying drawings in which:

DETAILED DESCRIPTION

Figure 2:
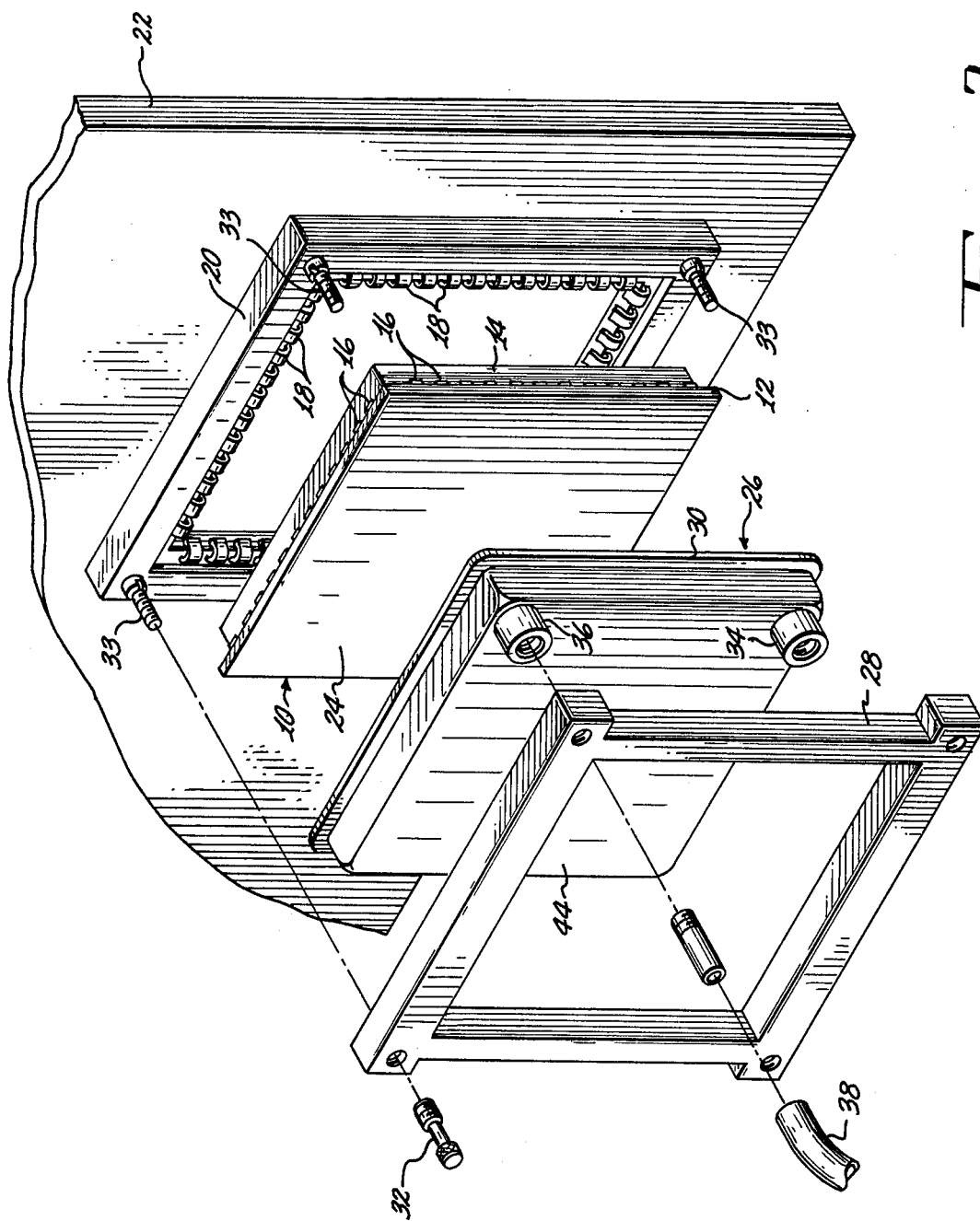
FIG. 2 is an exploded perspective view illustrating the relationships between a micropackage, a connector, a heat exchanger and a means for removably mounting them.
Figure 3:
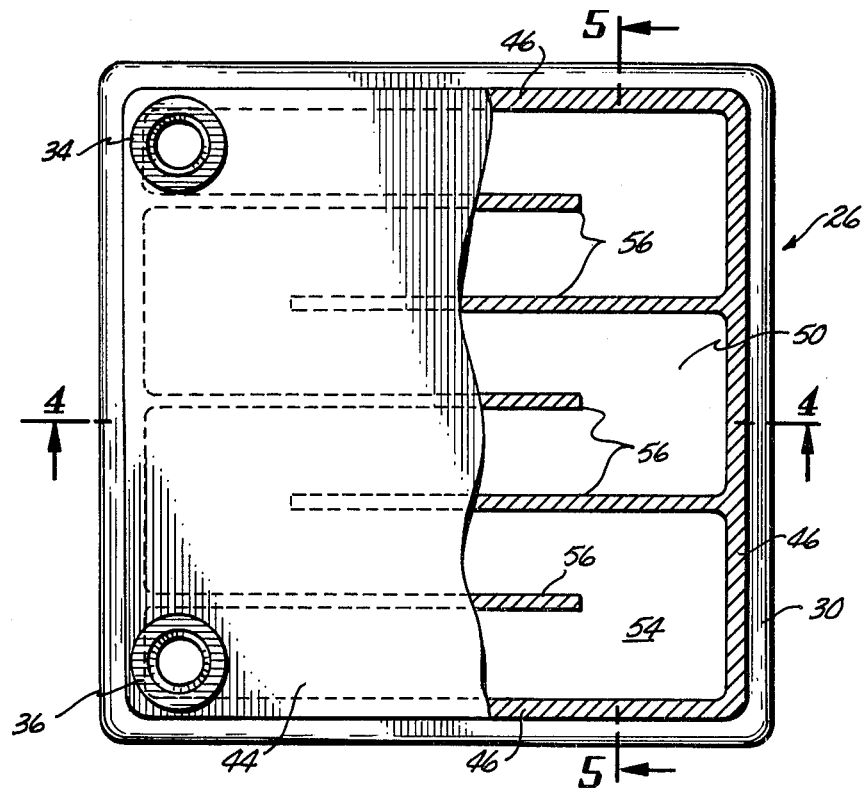
FIG. 3 is a plan view, partly broken away, of a heat exchanger.

Referring to FIG. 2, there is illustrated a multichip integrated circuit assembly or micropackage 10. While the details of micropackage 10 do not form a portion of this invention, the portions of micropackage 10 that are relevant to the understanding of the invention are illustrated. They are substrate 12 which has dimensions in the preferred embodiment of 80 millimeters by 80 millimeters square and from 1 to 2 millimeters thick. Substrate 12 is made of an electrically nonconductive ceramic material such as aluminum oxide. On one side, or face, of substrate 12 there is normally built up or formed a plurality of layers, up to 7 or 8 in some cases, of elctrical conductors separated by insulating layers. On the top surface of these layers a relatively large number, 80 to 100, of large scale integrated circuit chips can be mounted. The chips and the details of the layers of conductors and insulators are not illustrated since they form no part of the invention. In practice, the chips and the means for connecting them to the circuits formed on substrate 12 are covered by metal cover 14 which may be hermetically connected to substrate 12. Formed along the edges of substrate 10 is a plurality of electrical contacts 16 which engage contacts 18 of connector 20. Connector 20 is fixedly mounted on panel 22 which can also have multiple conductive layers formed on it to permit the circuits of a plurality of micropackages 10 to be interconnected and energized to form an electronic system. When a micropackage 10 is inserted into a connector 20 it can subsequently be removed to replace it or to repair it. To cool micropackages 10 which produce substantial quantities of heat, on the order of from 6 to 10 watts per square inch of the outer surface, or face, 24 of substrate 12, applicants have provided heat exchanger 26, the details of which are more fully illustrated in FIGS. 3, 4 and 5.

Figure 1:
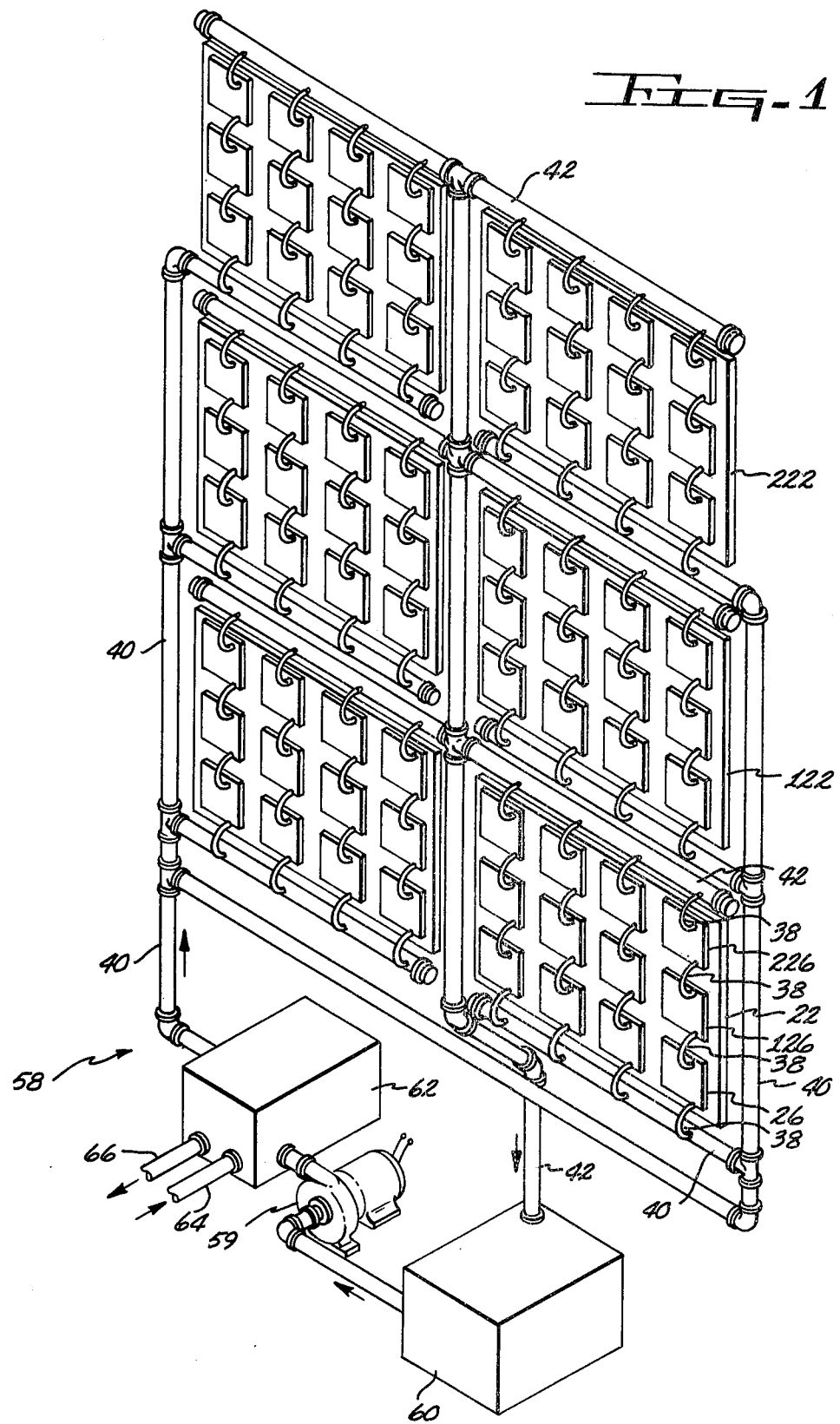
FIG. 1 is a schematic view of a cooling system for a large electronic system.
Figure 6:
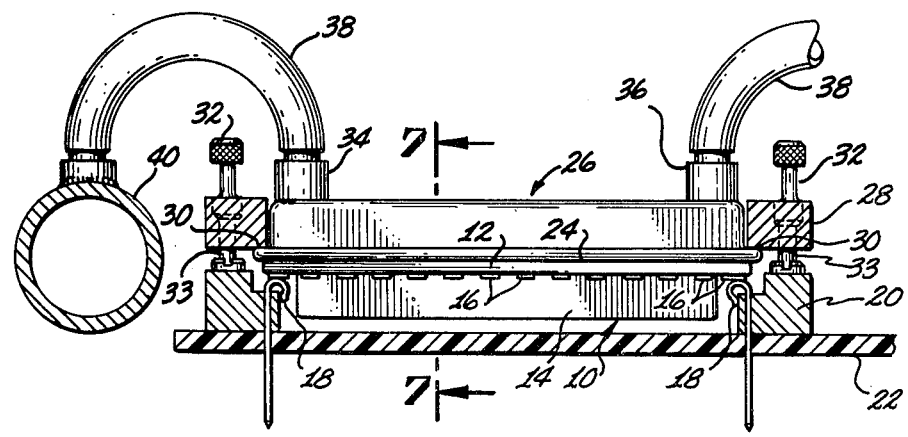
FIG. 6 is a side view partly in section of an assembled micropackage, connector, and heat exchanger.
Figure 7:
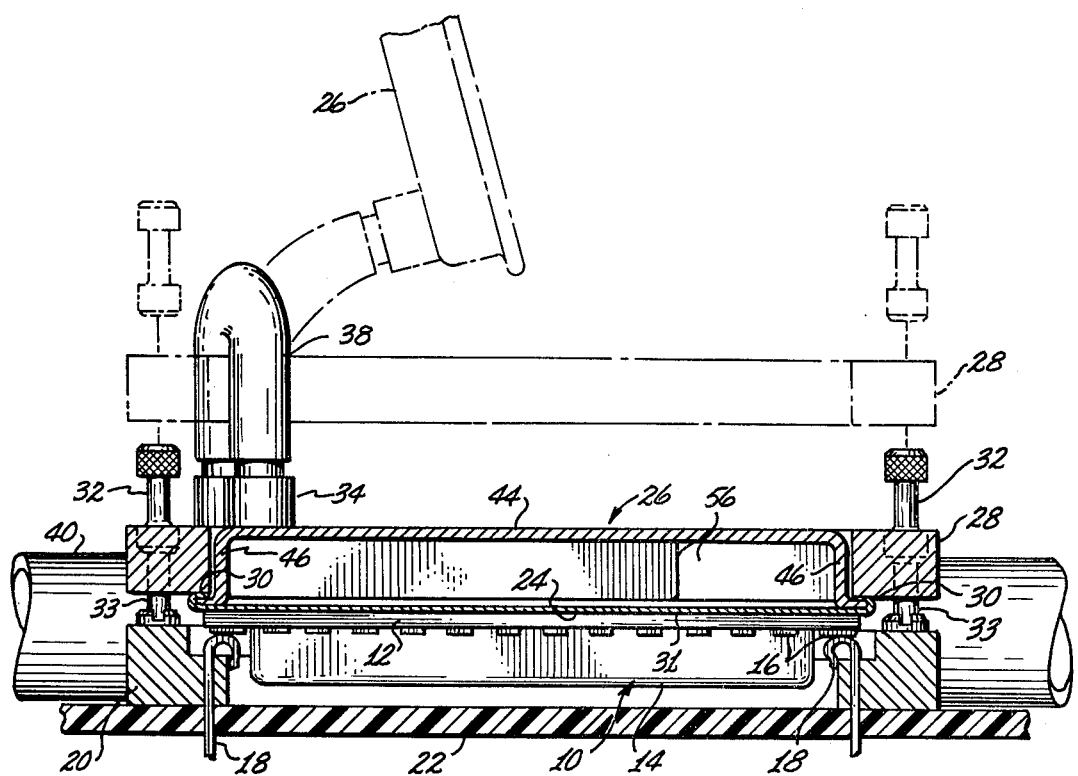
FIG. 7 is a section taken along 7—7 of FIG. 6, enlarged to better disclose details of the components illustrated. The position of the heat exchanger to permit removal of a micropackage from its connector is illustrated by dashed lines.

Referring now to FIGS. 6 and 7, connector 20 is fixedly mounted on panel 22. Micropackage 10 is positioned in connector 20 so that its contacts 16 make a good low resistance electrical contact with spring contacts 18 of connector 20. Micropackage 10 and heat exchanger 26 are held in fixed position as illustrated in FIG. 6 by mounting frame 28 which engages shoulder 30 of heat exchanger 26. The other side of shoulder 30 engages a portion of substrate 12 through flexible heat exchange wall 31 of heat exchanger 26 which is connected or sealed to the periphery of heat exchanger 26 at shoulder 30. Fastening means such as nuts 32 which threadably engage bolts 33 in cooperation with mounting frame 28 removably hold micropackage 10 in connector 20 and heat exchanger 26 in close proximity to the outer surface 24 of substrate 12. Heat exchanger 26 is provided with inlet means 34 and outlet means 36 so that a liquid heat exchange medium may low through heat exchanger 26 as will be better described later. The inlet 34 of heat exchanger 26 is connected through flexible hose or tubing 38 preferably made of polyvinyl chloride plastic to input manifold 40 containing a heat exchange medium of liquid under pressure. Outlet 36 is connected through flexible hose or tubing 38 to output manifold 42 as shown in FIG. 1. In FIG. 1 it can also be seen that several heat exchangers 26, 126, and 226 can be connected mounted one above the another, or vertically with respect to one another, and can be in series between input manifold 40 and output manifold 42.

Figure 4:
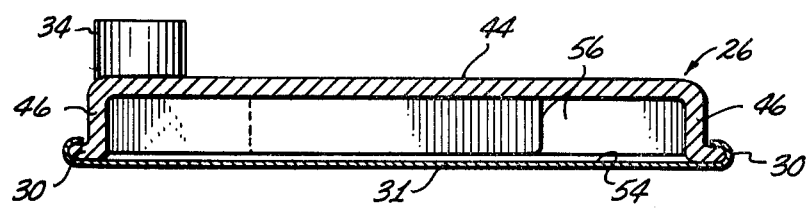
FIG. 4 is a section taken along line 4—4 of FIG. 3.

Referring now to FIG. 4, which is a cross section of heat exchanger 26, it can be seen that heat exchanger 26 has a back wall 44 and side walls 46. A flexible heat exchange wall 31 is fastened or bonded to the side walls 46 at shoulder 30 with a suitable epoxy, for example, so that the back wall, side walls and flexible wall 31 define a space 50 through which a suitable heat exchange liquid can flow. Back wall 44 and side walls 46 can be made of any suitable material such as plastic, copper or aluminum sufficiently thick to be substantially rigid. Heat exchange wall 31 is made of thin sheets of material to be flexible. Copper sheets having a thickness in the range from 0.010 to 0.002 inches is suitable for use in wall 31. Copper 0.005 inches thick is preferred for the flexible heat exchanger wall 31 when wall 31 has an area substantially equal to 9 square inches. Other good thermal conductors such as aluminum, silver or stainless steel can be used to form flexible wall 31. Inlet 34 and outlet 36 are illustrated as being formed in back wall 44 of heat exchanger 26. To assure the uniform flow of heat exchange medium over substantially all the inner surface 54 of heat exchange wall 31 it is desirable to provide baffles 56. As is heat seen in FIG. 3, baffles 56 provide a substantially uniform flow path for the coolant from inlet 34 to outlet 36. It should be noted that baffles 56 are attached to the back and side walls of heat exchanger 26 and are spaced from the inner surface 54 of flexible wall 31 so that the baffles 56 do not restrict movement of flexible wall 31. In a preferred embodiment the back and side walls 44 and 46 and baffles 56 are made integrally of a plastic material, such as a thermosetting polyester resin. A suitable example is VALOX 310, a product of the General Electric Company.

Figure 5:
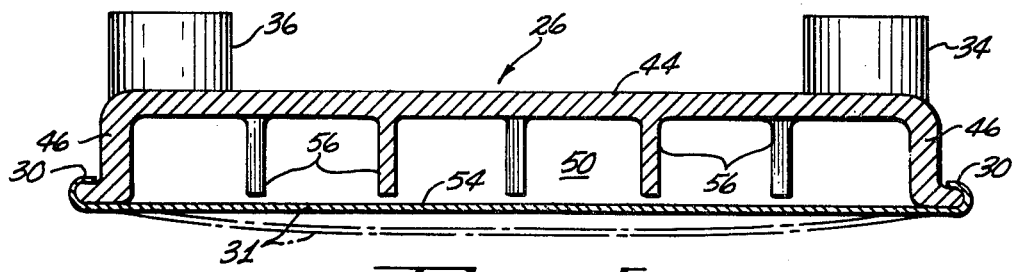
FIG. 5 is a section taken along line 5—5 of FIG. 3.

FIG. 5 illustrates, in an exaggerated manner, the extent to which flexible wall 31 may extend due to the pressure of the heat exchange liquid in space 50. This characteristic of wall 31 is the key to effective heat transfer from the substrate 12 of a micropackage 10 to the heat exchange liquid flowing through space 50 of heat exchanger 26.

Referring now to FIG. 1, there is illustrated a cooling system 58 for cooling six panels including panels 22, 122, 222, etc. Each panel can have up to 12 micropackages mounted on it, however the micropackages and the means for mounting them on the panels are not illustrated in FIG. 1. On panel 22, three heat exchangers 26, 126, and 226 are connected in series between an input manifold 40 and an output manifold 42. Any reasonable number of heat exchangers 26, 126, etc. can be connected between the input and output manifolds as long as the temperature of the heat exchange liquid in heat exchanger 226 which is directly connected to an output manifold 42 does not rise to a value where it ceases to adequately cool the integrated circuits of the micropackage 10 to be cooled by it.

The cooling system 58 has a conventional pump 59 powered by an electric motor which draws liquid coolant from the reservoir 60 and forces it through a conventional heat exchanger 62. In order to keep the temperature of the coolant below a predetermined maximum temperature, heat exchanger 62 is cooled by chilled water from a conventional source which is not illustrated which flows into heat exchanger 62 through chilled water inlt 64. Return flow is through outlet 66. The coolant of system 58 as it comes from heat exchanger 62 flows through input manifold 40 through flexible hose 38 to the inlet of heat exchanger 26. The coolant flows through the heat exchanger 26 to its outlet which in the embodiment illustrated is connected by another flexible hose 38 to the inlet of a heat exchanger 126. The outlet of the heat exchanger 126 is connected by still another flexible hose 38 to the inlet of heat exchanger 226. The outlet of heat exchanger 226 is connected to the output manifold 42 through a flexible hose 38. The coolant then flows through output manifold 42 into reservoir 60.

The heat exchange medium of liquid can be almost any suitable one such as silicone oil, ethylene gylcol, Freon 113, or water. While any of these coolants or heat exchange mediums are satisfactory, water is preferred because of its thermal property, because it permits lower pressures in system 58, and because it does not have a deleterious effect on the flexible hoses or tubings 38 and the other materials from which the cooling system may be fabricated. To minimize corrosion and potential odor problems, sterilized water is used to which is added a conventional corrosion inhibitor. An essentially closed cooling system is preferred to minimize the absorption of oxygen into the coolant. This further minimizes corrosion problems.

In a preferred embodiment heat exchanger 62 was set so that the maximum temerature of the water into input manifold 40° was 30° centigrade to minimize the risk of moisture condensing on elements of the cooling system. With the integrated circuit chips of the micropackages 10 producing power at the rate of 60 watts, the maximum temperature rise of the coolant through three heat exchangers connected in series was from 2° to 3+ centigrade with flow rates of around 0.2 gallons per minute flowing through each heat exchanger 26. This was more than adequate to maintain the maximum temperature of the semiconductor chips in the warmest micropackage 10° C below their macimum operating temperature. It has been found that a pressure of from one to two pounds per square inch in a heat exchanger 26 is adequate to cause its flexible wall 1 to positively engage the exposed surface 24 of a substrate 12 of a micropackage 10, notwithstanding that the substrate 10 is not perfectly planar as was pointed out above. The uper limit of the pressure in the preferred embodiment of heat exchanger 26 at which flexible wall 31 will not be stressed beyond its elastic limit is approximately 10 psi. In cooling system 58 illustrated in FIG. 1, the minimum pressure in the highest micropackages needed to cause flexible wall 31 to positively engage surfce 24 of a substrate 12 is substantially 1 psi. The maximum pressure in the lowest micropackage, such as micropackage 26 in FIG. 1, is approximately 5 psi which sum is composed of the sum of the minimum pressure in the highest heat exchanger the hydrostatic pressure of approximately four feet of water, the difference in the height between the highest output manifold 42 and the lowest heat exchanger which substantially equals 1.75 psi, and the pressure needed to cause coolant to flow through the micropackages at the desired rate of 0.2 gal/minute which is approximately 1.25 psi. If the minimum pressure in the highest micropackage in the system illustrated in FIG. 1 is substantially 1 psi, the pressure in the lowest micropackage will be approximately 4 psi. The operational range of pressures for the heat exchangers is from 1 to 10 psi for the preferred embodiment of micropackage 26. As a result, a good low thermal impedance path is provided from the substrates 12 of the micropackages to the coolant in heat exchangers 26 without the use or necessity of any thernal greases or oils between a heat exchanger and a substrate. The elimination of such materials avoids possible problems due to contamination of the electrical contacts of either the substrate or the connector by such materials.

As long as cooling system 58 is operational, liquid will be flowing through all the heat exchangers 10 in the system. Referring to FIG. 7, if a micropackage 10 needs to be replaced or worked on, it is only necessary to remove the fasteners 32 to remove the mounting frame 28. When frame 28 is removed, heat exchanger 26 can be moved aside as shown by the dashed lines of FIG. 7 without disrupting or opening up cooling system 58. Coolant continues to flow through all heat exchangers 26, and specifically all the heat exchangers connected in series with it. Thus, it is possible to continue to energize other micropackages 10 of the electronic system and to continue to cool them even when one or more micropackages 10 has been removed from its corresponding connector 20.

It will be apparent to those skilld in the art that the disclosed cooling system for electronic systems may be modified in numerous ways and may assume many embodiments other than the preferred form specifically set forth above and described above. Accordingly, it is intended by the appended claims to cover all modifications of the invention which fall within the true spirit and scope thereof.

What is claimed is:

1. A heat exchanger for a multichip integrated circuit assembly comprising:
a substantially rigid back wall,
substantially rigid side walls integrally connected to said back wall,
a flexible wall made of thermal conducting material connected to said side walls, said back, side and flexible walls defining a closed space adapted to contain a liquid under pressure substantially in the range of from 1 to 10 pounds per square inch, inlet means and outlet means formed in said rigid walls for permitting a liquid coolant to flow through said space and baffle means rigidly attached to said substantially rigid wall for causing said heat exchanger medium to flow substantially uniformly over the flexible wall forming said space without limiting movement of said wall.

2. A heat exchanger as defined in claim 1 in which the back wall, side walls, and baffle means are made integrally and of a plastic material and in which the flexible wall is made of a thin sheet of copper.

3. A heat exchanger comprising:
substantially rigid wall means defining a periphery substantially located in a plane,
a flexible wall having an area substantially in the rangeof from 25 to 64 square centimeters made of a thermal conducting material connected to the periphery of sid wall means to define a closed space adapted to contain a liquid under pressure,
inlet means and outlet means formed in said wall means to permit liquid to flow through said closed space, and
means attached to said wall means for causing liquid to flow substantially uniformly over the fflexible wall without limiting the movement of the said flexible wall.

4. A heat exchanger as defined in claim 3 in which the flexible wail is made of copper and the substantially rigid wall mens are made of a plastic material.

5. A heat exchanger comprising:
means forming a chamber adapted to contain a liquid, a portion of sid means being a substantially planar flexible thin wall having an area substantially in the range of from 25 to 64 square centimetersand made of a good thermal conductor,
inlet means and outlet means formed in said chamber for permitting a liquid having a pressure substantially in the range of from 1 to 10 pounds per square inch to flow through said chamber, and
means within said chamber for causing said liquid to flow substantially uniformly over the flexible thin wall of said chamber means, said means within said chamber being spaced from said flexible thin wall.

6. A heat exchanger as defined in claim 5 in which the good thermal conductor is copper.

* * * * *